US012648087B2

(12) United States Patent
Yang

(10) Patent No.: US 12,648,087 B2
(45) Date of Patent: Jun. 2, 2026

(54) METHOD FOR MANUFACTURING STUB-FREE VIA HOLE, PCB, ELECTRONIC DEVICE, AND STORAGE MEDIUM

(71) Applicant: SUZHOU METABRAIN INTELLIGENT TECHNOLOGY CO., LTD., Jiangsu (CN)

(72) Inventor: Tianqi Yang, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 211 days.

(21) Appl. No.: 18/714,044

(22) PCT Filed: Dec. 23, 2022

(86) PCT No.: PCT/CN2022/141681
§ 371 (c)(1),
(2) Date: May 28, 2024

(87) PCT Pub. No.: WO2023/179135
PCT Pub. Date: Sep. 28, 2023

(65) Prior Publication Data
US 2025/0024612 A1      Jan. 16, 2025

(30) Foreign Application Priority Data
Mar. 24, 2022      (CN) ......................... 202210293402.X

(51) Int. Cl.
*H05K 3/42*           (2006.01)
*H05K 1/11*           (2006.01)
(52) U.S. Cl.
CPC ............. *H05K 3/421* (2013.01); *H05K 1/115* (2013.01)
(58) Field of Classification Search
CPC ..................................................... H05K 3/421

USPC ......................................................... 174/262
See application file for complete search history.

(56) References Cited

U.S. PATENT DOCUMENTS 9,872,399 B1      1/2018  Doyle et al.
2013/0048355 A1*  2/2013  Furuta .................. H05K 3/4602
                                            174/257
2018/0027665 A1*  1/2018  Doyle .................... H05K 1/034
                                            174/258

FOREIGN PATENT DOCUMENTS

CN        101257772 A      9/2008
CN        114390804 A      4/2022

OTHER PUBLICATIONS

International search report for PCT/CN2022/141681 mailed on Feb. 11, 2023.

* cited by examiner

*Primary Examiner* — Stanley Tso
(74) *Attorney, Agent, or Firm* — Dennemeyer & Associates LLC

(57)           ABSTRACT

Embodiments of the present disclosure relate to the technical field of PCBs, and in particular, relate to a method for manufacturing a stub-free via hole, a PCB, an electronic device, and a non-transitory readable storage medium. The method for manufacturing a stub-free via hole comprises: acquiring a target copper plating length of a to-be-opened via hole; forming a through-hole at a position of the to-be-opened via hole along a thickness direction of a PCB; blocking the through-hole to form a blind hole, so that a distance from a bottom of the blind hole to a surface of the PCB is equal to the target copper plating length; and performing copper plating on an inner wall of the blind hole to form a via hole.

19 Claims, 9 Drawing Sheets

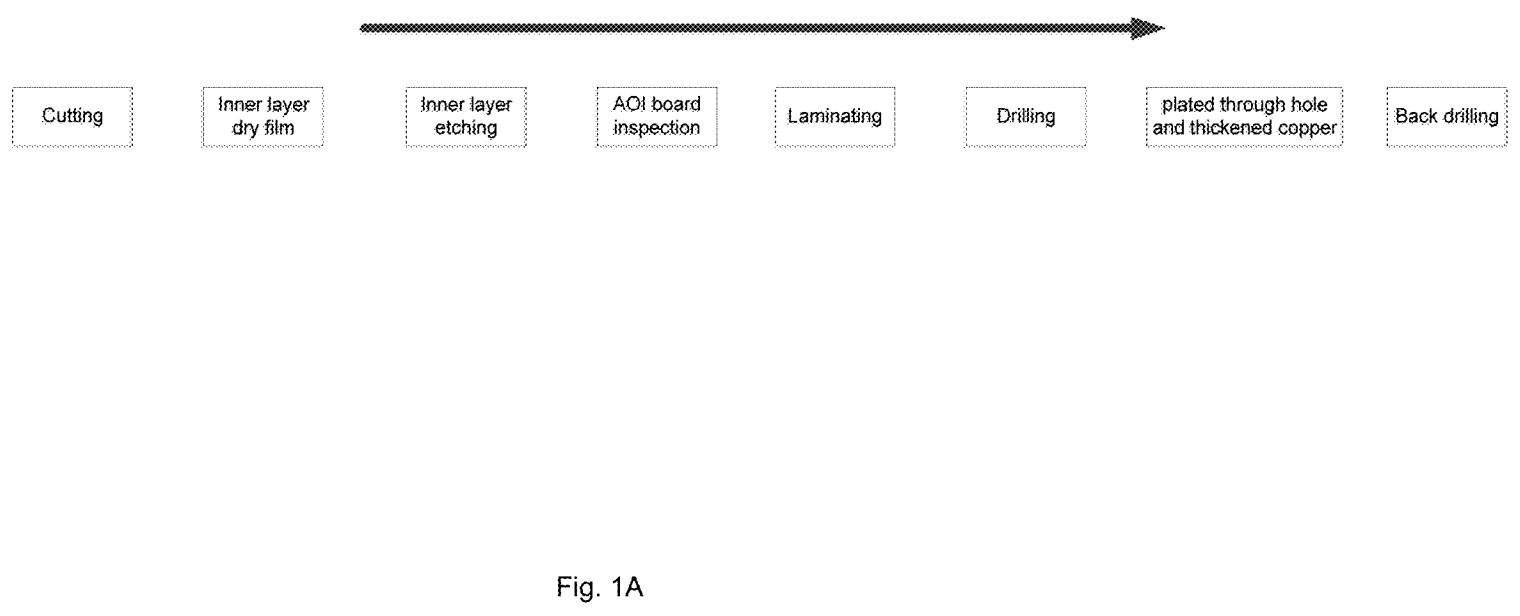

Cutting

Inner layer dry film

Inner layer etching

AOI board inspection

Laminating

Drilling plated through hole and thickened copper

Back drilling

Fig. 1A

Stub formed by back drilling

Top layer

Second wiring layer

Third wiring layer

Fourth wiring layer

Fifth wiring layer

Sixth wiring layer

Seventh wiring layer

Bottom layer

PCB

Through-hole

1

METHOD FOR MANUFACTURING STUB-FREE VIA HOLE, PCB, ELECTRONIC DEVICE, AND STORAGE MEDIUM

CROSS-REFERENCE TO RELATED APPLICATIONS

This is a 35 U.S.C. 371 National Stage Patent Application of International Application No. PCT/CN2022/141681, filed Dec. 23, 2022, which claims priority to Chinese application 202210293402.X, filed Mar. 24, 2022, each of which is hereby incorporated by reference in its entirety.

TECHNICAL FIELD

Embodiments of the present disclosure relate to the technical field of PCBs (Printed Circuit Boards), and in particular, to a method for manufacturing a stub-free via hole, a PCB, an electronic device, and a non-transitory readable storage medium.

BACKGROUND

In a circuit board, a line jumps from a first face of the board to a second face, and a hole connecting two connecting lines is also called a via hole (which is different from a pad in which there is no paste mask on a side). The via hole is also referred to as a plated-through-hole. In a dual-face board and a multi-layered board, in order to connect printed wirings between various layers, a common hole, i.e. the via hole, is drilled at junctions of wirings required to be connected in the layers. In terms of process, a metal layer is plated on a cylindrical surface of a wall of the via hole by using a chemical deposition method, to connect copper foils requiring to be connected at various intermediate layers, and upper and lower surfaces of the via hole are formed into circular pad shapes. A conventional manufacturing process for a PCB with the via hole is as shown in FIG. 1A, in which AOI represents Automated Optical Inspection, since a through-hole is opened during hole opening, the whole through-hole is plated with copper, and then excessively plated copper is removed in a back drilling manner, and a stub of the via hole refers to a part in the via hole in which a signal line does not runs through. In a server design, especially in a PCIE (peripheral component interconnect express, a high-speed serial computer extended bus standard) 5.0 high-speed signal interconnect topological link PCI-Express (peripheral component interconnect express, a high-speed serial computer extended bus standard), as the signal rate increases, a signal changes along with an operating environment, and damage also changes accordingly. Especially, regarding a length effect of a via hole stub in the link, the longer the stub is, the greater an antenna effect is, thereby increasing signal interference, which directly results in reduction of a signal integrity of the link.

Currently, a conventional manner for manufacturing the via hole relies on back drilling to remove the stub, however, the manner for back drilling to remove the stub has following problems: if back drilling process is performed by using a large drill bit, it is difficult to effectively back drill the excessive stub, and a routing space of a back-drilled layer is also affected, and if the back drilling area is large, the routing space will be correspondingly reduced; moreover, a minimum distance between two via holes becomes larger, which increases the difficulty in PCB design, especially in positions where the space is crowded on the PCB. On the other hand, if back drilling process is performed by using a small drill bit, offset may occur on the drill bit due to errors in PCB processing, resulting in unsuccessful back drilling, as shown in FIG. 1B. In this case, the stub still exists, which affects the signal integrity. In addition, when there are a large number of signals requiring to be back drilled in the PCB, the back drilling error will increase, thereby reducing a probability of successful processing of the PCB and increasing the scrap rate. Due to a problem of precision control in industrial manufacturing, both back drilling by the large drill bit and back drilling by the small drill bit cannot completely remove the stub, and generally 8-12 mils of residual stub will exist.

SUMMARY

In view of this, regarding the problem that a stub cannot be completely removed by back drilling the stub, it is necessary to provide a method for manufacturing a stub-free via hole, a PCB, an electronic device and a non-transitory readable storage medium.

According to a first aspect of embodiments of the present disclosure, provided is a method for manufacturing a stub-free via hole; the method includes:

a target copper plating length of a to-be-opened via hole is acquired;

a through-hole is formed at a position of the to-be-opened via hole along a thickness direction of a PCB;

the through-hole is blocked to form a blind hole, so that a distance from the bottom of the blind hole to a surface of the PCB is equal to the target copper plating length; and an inner wall of the blind hole is subjected to copper plating to form a via hole.

In some embodiments, a step that the through-hole is blocked to form the blind hole, so that the distance from the bottom of the blind hole to the surface of the PCB is equal to the target copper plating length, includes:

an insertion member matching a shape of the through-hole is manufactured and the insertion member is inserted into the through-hole from a first surface of the PCB, wherein a length of the insertion member remaining in the through-hole is equal to the target copper plating length, and the first surface is a surface where the to-be-opened via hole intersects the PCB;

from a second surface opposite the first surface, a region where the insertion member is not inserted into the through-hole is filled with resin; and the insertion member is removed from the through-hole to form a blind hole.

In some embodiments, a step that the through-hole is blocked to form the blind hole, so that the distance from the bottom of the blind hole to the surface of the PCB is equal to the target copper plating length, includes:

an insertion member matching a shape of the through-hole is manufactured and the insertion member is inserted into the through-hole from a second surface opposite a first surface of the PCB to form the blind hole, wherein a length of the insertion member remaining in the through-hole is equal to a difference between the thickness of the PCB and the target copper plating length.

In some embodiments, the insertion member is made of an elastic material, and after being inserted into the through-hole, a side wall of the insertion member is attached to a side wall of the through-hole.

In some embodiments, before a step that the inner wall of the blind hole is subjected to copper plating to form the via hole, the method further includes:

upper and lower surfaces of the filled resin are respectively electroplated and filled-in, to form a copper layer of a preset thickness.

In some embodiments, the method further includes:

a release agent is applied to a surface of the insertion member before the insertion member is inserted into the through-hole.

In some embodiments, after a step that the inner wall of the blind hole is subjected to copper plating to form the via hole, the method further includes:

the insertion member is removed from the through-hole.

In some embodiments, the PCB is internally provided with at least one wiring layer, and the target copper plating length is equal to a distance from any wiring layer inside the PCB to the surface of the PCB.

In some embodiments, the target copper plating length refers to a desired copper plating length during via hole design.

In some embodiments, during design of the via hole in the PCB, in cases where a third wiring layer for connecting a top wiring layer of the PCB to the inside is reserved, the target copper plating length is a distance from the top wiring layer to the third wiring layer.

In some embodiments, the through-hole is blocked, includes: a partial region of the opened through-hole is blocked.

In some embodiments, a way of blocking includes dividing the through-hole into two parts at a blocking position or directly blocking a part of the through-hole.

In some embodiments, the first surface and the second surface refer to two surfaces of the PCB, and the first surface is an uppermost layer among wiring layers, or a bottom layer among wiring layers.

In some embodiments, from the second surface opposite the first surface, a region where the insertion member is not inserted into the through-hole is filled with resin, includes: the resin is pre-heated to be molten into a molten state, then a position of the through-hole not shielded by the insertion member is filled with the resin in the molten state, and thus this part of the region of the through-hole is completely filled.

In some embodiments, when a plurality of via holes exist on the PCB, the method further includes: a part of length is reserved when the insertion member corresponding to each via hole among the plurality of via holes is manufactured, an end of the insertion member corresponding to each via hole is fixed on a jack panel according to a positional relationship between the via holes.

In some embodiments, the jack panel and the insertion member corresponding to the each via hole are connected in a detachable manner.

In some embodiments, an aperture of the insertion member made of the elastic material is larger than an aperture of the through-hole, so that a part of the insertion member plugged into the through-hole presses the side wall of the through-hole.

According to a second aspect of embodiments of the present disclosure, further provided is a PCB, wherein the PCB includes at least one via hole, and the at least one via hole is formed by using the method for manufacturing a stub-free via hole as described above, and the method for manufacturing a stub-free via hole includes the following steps:

a target copper plating length of a to-be-opened via hole is acquired;

a through-hole is formed at a position of the to-be-opened via hole along the thickness direction of a PCB;

the through-hole is blocked to form a blind hole, so that the distance from the bottom of the blind hole to the surface of the PCB is equal to the target copper plating length; and an inner wall of the blind hole is subjected to copper plating to form a via hole.

According to a third aspect of embodiments of the present disclosure, further provided is an electronic device, wherein the electronic device includes the PCB with at least one via hole, and the at least one via hole is formed by using the method for manufacturing a stub-free via hole as described above, and the method for manufacturing a stub-free via hole includes the following steps:

a target copper plating length of a to-be-opened via hole is acquired;

a through-hole is formed at a position of the to-be-opened via hole along the thickness direction of a PCB;

the through-hole is blocked to form a blind hole, so that the distance from the bottom of the blind hole to the surface of the PCB is equal to the target copper plating length; and an inner wall of the blind hole is subjected to copper plating to form a via hole.

The method for manufacturing a stub-free via hole improves the conventional via hole manufacturing process. Before copper plating is performed on the through-hole, the through-hole is blocked according to an expected copper plating length of the via hole so as to form a blind hole; as a part where a stub may be formed is shielded, copper will not be attached at this position during subsequent copper plating, so that a via hole stub is completely removed, thereby solving the effect of the via hole stub on the signal integrity of a high-speed line signal link. Compared with the conventional back drilling process, a stub may not be left, thereby achieving the effect of completely removing the via hole stub.

In addition, the embodiments of the present disclosure further provide a PCB and an electronic device, which can also achieve the described technical effects, and will not be repeated here.

According to another aspect of the embodiments of the present application, further provided is a non-transitory readable storage medium, the non-transitory readable storage medium including a stored program, which when running, executes the described steps.

Embodiments of the present disclosure further provide a computer program product containing instructions that, when running on a computer, cause the computer to execute the steps in the method above.

BRIEF DESCRIPTION OF THE DRAWINGS

In order to describe the technical solutions in the embodiments of the present disclosure or in the related art more clearly, hereinafter, accompanying drawings requiring to be used for describing the embodiments or the related art are introduced briefly. Apparently, the accompanying drawings in the following description merely relate to some embodiments of the present disclosure, and for a person of ordinary skill in the art, other embodiments can also be derived from these accompanying drawings without involving any inventive effort.

FIG. 1A is a processing flowchart of a conventional PCB with a via hole;

5

6

Figure 1B:
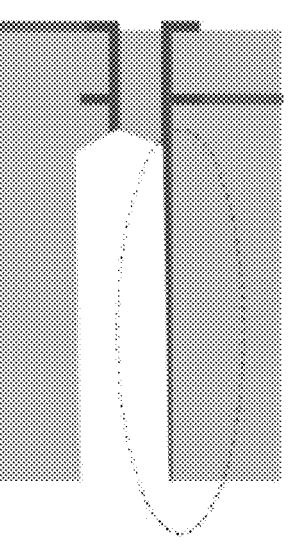
FIG. 1B is a schematic diagram of a via hole obtained by processing using the manner shown in FIG. 1A.
Figure 2:
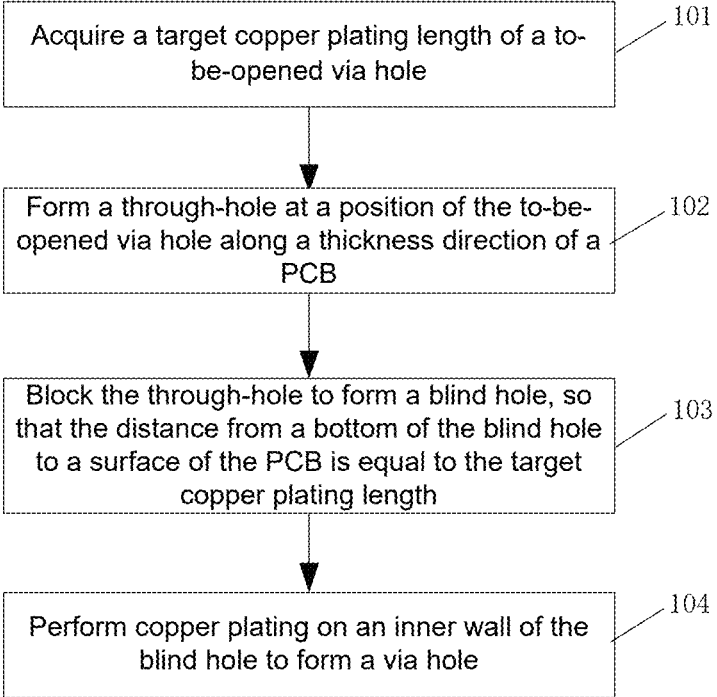
Figure 3:
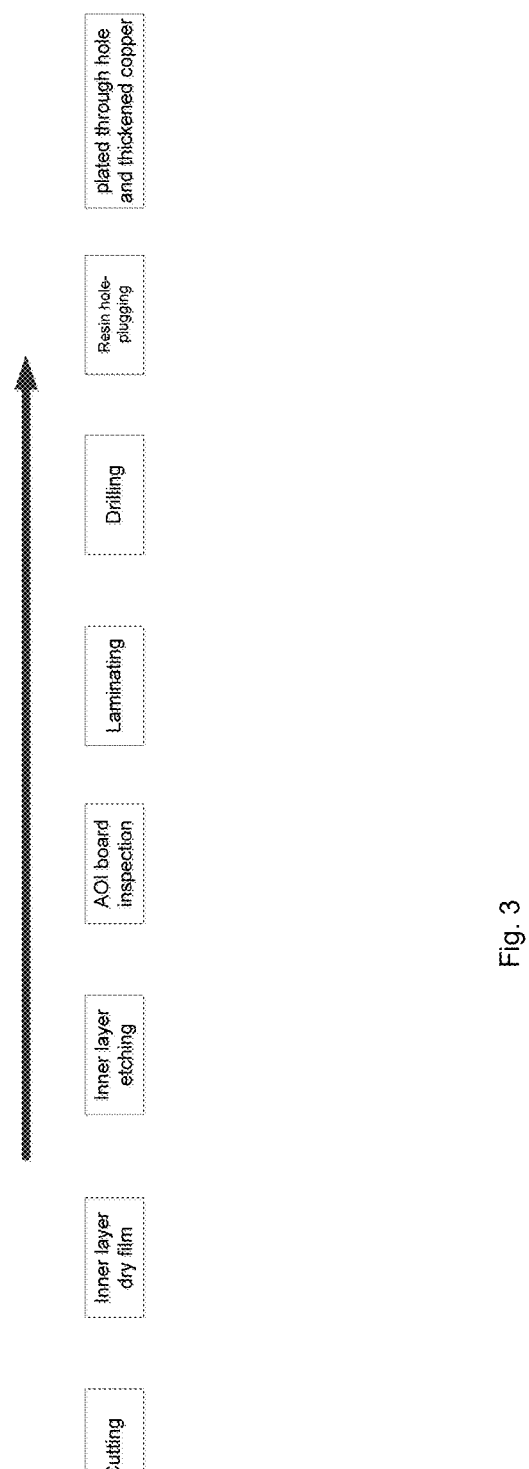
Figure 4:
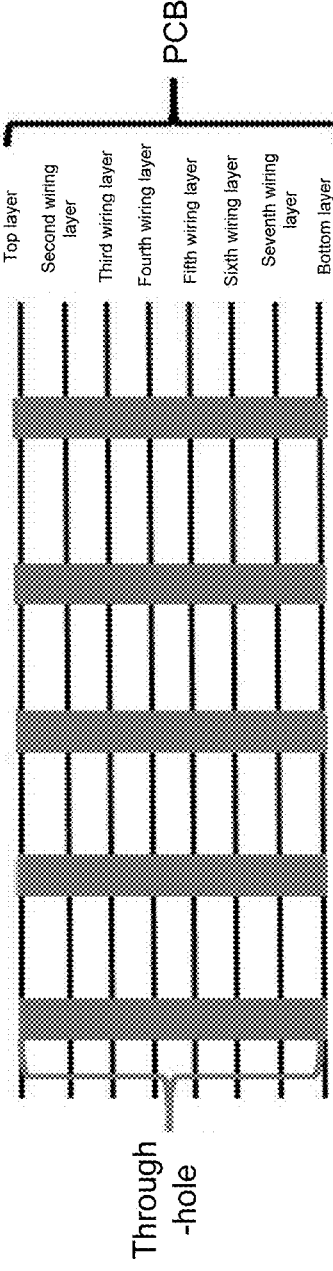
Figure 5:
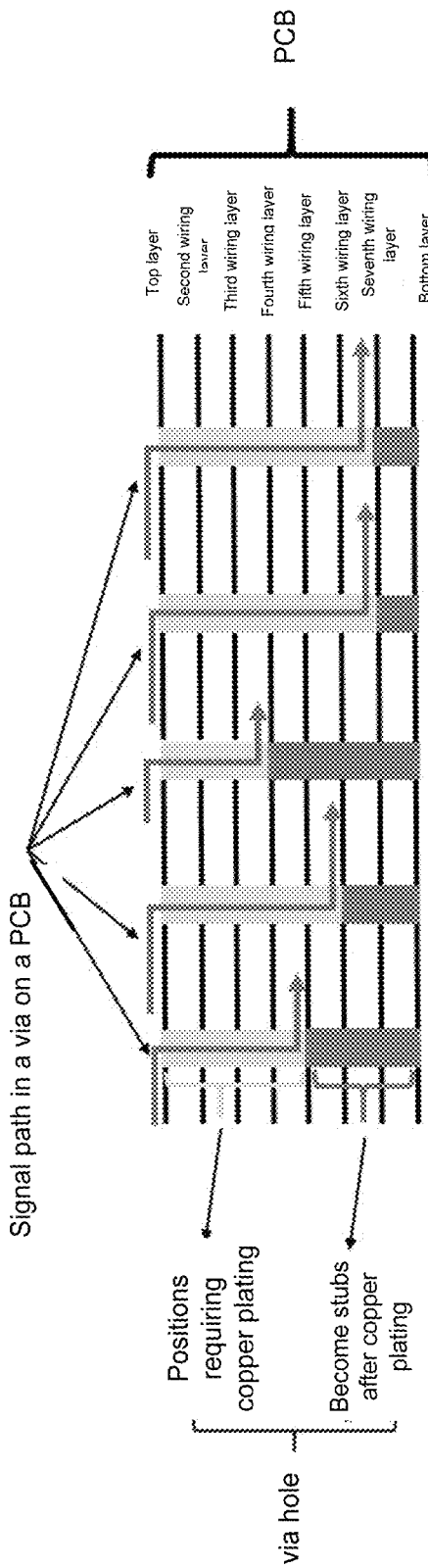
Figure 6:
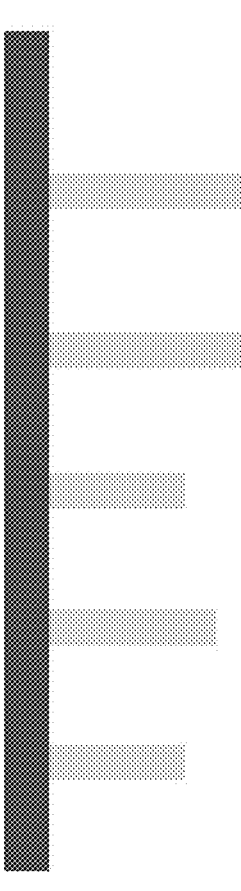
Figure 7:
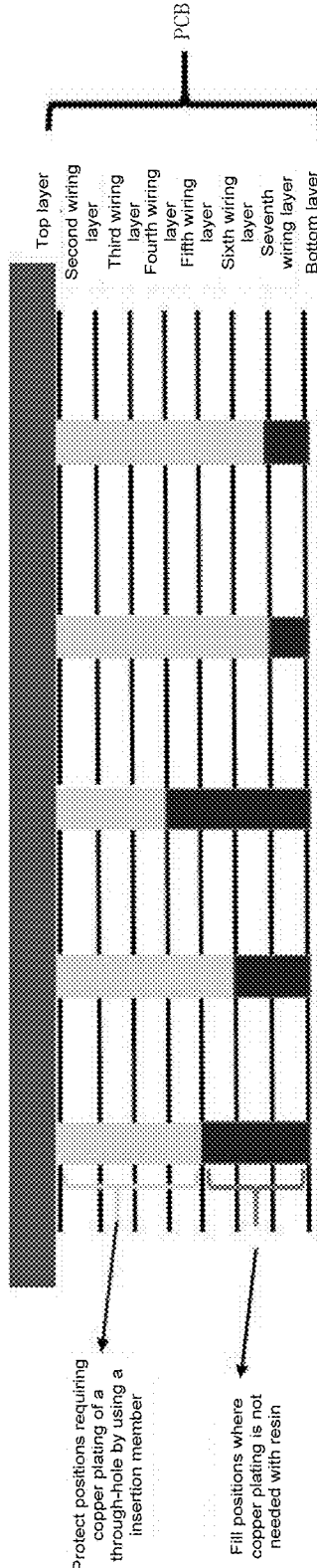
Figure 8:
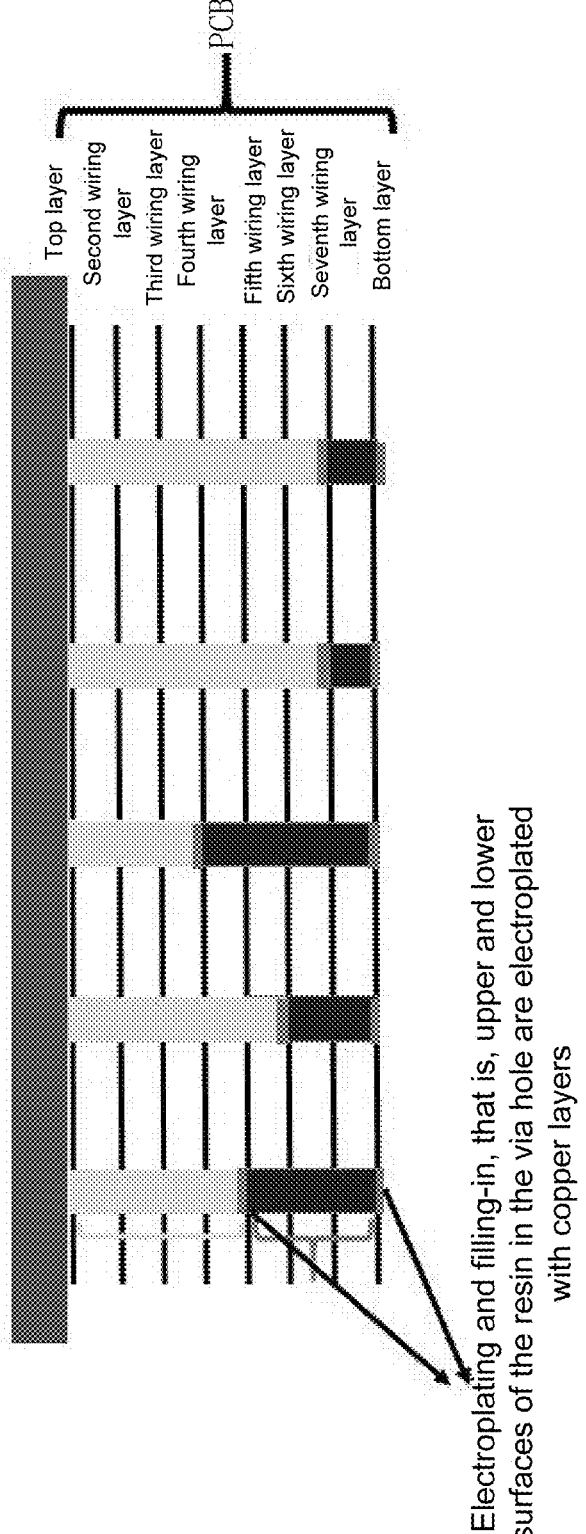
Figure 9:
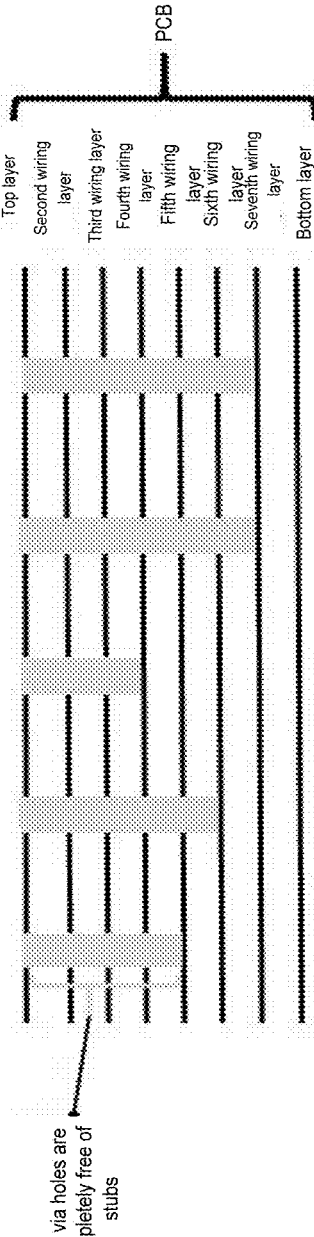

FIG. 2 is a schematic flowchart of a method 100 for manufacturing a stub-free via hole provided according to some embodiments of the present disclosure;

FIG. 3 is a schematic flowchart of processing a PCB provided according to some other embodiments of the present disclosure;

FIG. 4 is a schematic diagram of a through-hole formed by drilling a PCB provided according to some embodiments of the present disclosure;

FIG. 5 is a schematic diagram of a via hole in a PCB provided according to some embodiments of the present disclosure;

FIG. 6 is a schematic structural diagram of an insertion member provided according to some embodiments of the present disclosure;

FIG. 7 is a schematic diagram of inserting an insertion member into a through-hole to form a blind hole provided according to some embodiments of the present disclosure;

FIG. 8 is a schematic diagram of a via hole after electroplating and filling-in provided according to some embodiments of the present disclosure; and FIG. 9 is a schematic structural diagram of a via hole manufactured by using the method in embodiments of the present disclosure provided according to some embodiments of the present disclosure.

DETAILED DESCRIPTION OF THE EMBODIMENTS

In order to make objects, technical solutions and advantages of embodiments of the present disclosure clearly understood, hereinafter, embodiments of the present disclosure will be described in detail in conjunction with optional embodiments and with reference to the accompanying drawings.

In the illustration of embodiments of the present disclosure, it should be understood that orientation or positional relationships indicated by terms such as "center", "longitudinal", "transverse", "length", "width", "thickness", "upper", "lower", "front", "rear", "left", "right", "vertical", "horizontal", "top", "bottom", "inner", "outer", "clockwise", "counterclockwise", etc. are orientation or positional relationships based on those as shown in the accompanying drawings, are only used to facilitate the illustration of the embodiments of the present disclosure and to simplify the illustration, rather than indicating or implying that an apparatus or element referred to must have a specific orientation, and be constructed and operated in the specific orientation, and therefore said terms cannot be understood as limitation to the embodiments of the present disclosure.

In addition, terms "first" and "second" are only used for descriptive purposes, and cannot be understood as indicating or implying relative importance or implicitly indicating the number of indicated technical features. Thus, features defined by "first" and "second" may explicitly or implicitly comprise one or more of the features. In the illustration of embodiments of the present disclosure, the meaning of "a plurality of" is two or two and more, unless explicitly and specifically defined otherwise. In addition, the terms "mount", "connect to", "connect" should be understood broadly, and for example, may be fixed connection, and may also be detachable connection, or integral connection; may be mechanical connection, and may also be electrical connection; and may be direct connection, and may also be indirect connection by means of an intermediate medium, and may also be interior communication between two elements. For a person of ordinary skill in the art, meanings of the described terms in embodiments of the present disclosure could be understood according to specific situations.

In some embodiments, please refer to FIG. 2, FIG. 2 shows a schematic flowchart of a method 100 for manufacturing a stub-free via hole provided according to some embodiments of the present disclosure. In detail, the method may include the following steps:

Step 101, a target copper plating length of a to-be-opened via hole is acquired.

In this embodiment, the to-be-opened via hole may be a via hole of any existing signal link, and signals that are able to be transmitted by the to-be-opened via hole includes but is not limited to PCIE (a high-speed serial computer extended bus standard) and I2C (Inter-Integrated Circuit, which is a call for an internal integrated circuit and is a serial communication bus). The target copper plating length may be obtained according to a design file or by theoretical calculation, and the target copper plating length refers to a desired copper plating length during via hole design. For example, during design of a certain via hole in the PCB, a third wiring layer for connecting a top wiring layer of the PCB to the inside is reserved, and then in this case, the target copper wire length is a distance from the top wiring layer to the third wiring layer, and of course, during PCB design, the copper plating length of the via hole may be directly defined by using a numerical value.

Step 102, a through-hole is formed at a position of the to-be-opened via hole along a thickness direction of the PCB.

In an implementation process, the through-hole may be opened by using an existing hole opening manner, for example, by using a drill bit or a puncher; and a shape of the through-hole includes, but is not limited to, a cylinder, a prism, and the like.

Step 103, the through-hole is blocked to form a blind hole, so that a distance from a bottom of the blind hole to a surface of the PCB is equal to the target copper plating length.

In this embodiment, blocking the through-hole refers to blocking a partial region of the opened through-hole; and a way of blocking includes, but is not limited to, dividing the through-hole into two parts at a blocking position or directly blocking a part of the through-hole.

Step 104, an inner wall of the blind hole is plated with copper to form a via hole.

The method for manufacturing a stub-free via hole improves the conventional via hole manufacturing process. Before copper plating is performed on the through-hole, the through-hole is blocked according to an expected copper plating length of the via hole so as to form a blind hole; as a part where a stub may be formed is shielded, copper will not be attached at this position during subsequent copper plating, so that a via hole stub is completely removed, thereby solving an effect of the via hole stub on a signal integrity of a high-speed line signal link. Compared with a conventional back drilling process, the stub may not be left, thereby achieving an effect of completely removing the via hole stub.

In some embodiments, the step 103 that the through-hole is blocked to form the blind hole, so that the distance from the bottom of the blind hole to the surface of the PCB is equal to the target copper plating length, includes:

Step 1, an insertion member matching the shape of the through-hole is manufactured and the insertion member is inserted into the through-hole from a first surface of the PCB, wherein a length of the insertion member remaining in the through-hole is equal to the target copper plating length, and the first surface is a surface where the to-be-opened via hole intersects the PCB.

In this embodiment, the insertion member may be made of wood, rubber, resin, or plasticine having plasticity, etc., and an insertion and plugging position is a position during subsequent copper plating, and plugging the position can prevent resin from filling into a copper plating position when blocking the through-hole, thereby ensuring the precision of the blocking position during subsequent blocking, which will not hinder the copper plating region while also be able to accurately block a region forming the stub. The first surface and a second surface refer to two surfaces of the PCB, and the first surface may be an uppermost layer among wiring layers and may also be a bottom layer among the wiring layers. Generally, in an actual implementation process, the via hole is in communication with a top layer of the PCB, and thus without special provisions, the first surface is a top surface of the PCB, and the second surface is a bottom surface of the PCB.

Step 2, from the second surface opposite the first surface, a region where the insertion member is not inserted into the through-hole is filled with resin.

In an implementation process, during resin filling, a solid state or a molten state may be used, and in some embodiments, in order to ensure a blocking effect, the resin may be pre-heated to be molten into a molten state, then the position of the through-hole not shielded by the insertion member is filled with the resin in the molten state; thus, this part of the region of the through-hole is able to be completely filled, that is, the region is effectively shielded, so that copper cannot be attached to this region during subsequent copper plating, and thus the stub cannot be formed.

Step 3, the insertion member is removed from the through-hole to form a blind hole.

In the present embodiment, first, the insertion member is inserted into a region requiring copper plating in the through-hole, so that a filling region is able to be accurately positioned during resin filling, and the through-hole is precisely divided into two parts, thereby effectively shielding a stub forming position, ensuring that a routing region of the signal line is not affected, significantly reducing the scrap rate and saving resources.

In some embodiments, the step 103 that the through-hole is blocked to form the blind hole, so that the distance from the bottom of the blind hole to the surface of the PCB is equal to the target copper plating length, includes:

an insertion member matching the shape of the through-hole is manufactured and the insertion member is inserted into the through-hole from the second surface opposite the first surface of the PCB to form the blind hole, wherein a length of the insertion member remaining in the through-hole is equal to a difference between the thickness of the PCB and the target copper plating length.

In this embodiment, different from blocking the through-hole by using resin, the insertion member of this embodiment is able to directly block the through-hole, that is, the insertion member is directly inserted into a region where the stub may be formed. Although the blocking effect may be slightly poorer than that of resin blocking, the operation procedure is relatively simple, the implementation is convenient, and the manufacturing efficiency of the through-hole is increased.

It should be particularly noted that, in an implementation process, when a plurality of via holes exist on the PCB, in order to facilitate rapid placement and take-out of the insertion member corresponding to each of the via holes, a part of length is able to be reserved when the insertion member is manufactured; and then an end of the insertion member corresponding to the each via hole is fixed on a jack panel according to a positional relationship between the via holes. In some embodiments, the jack panel and the insertion members are able to be connected in a detachable manner, and for different circuit boards, only an insertion member of a required length needs to be replaced, so that the insertion members and the jack panel are able to be used repeatedly.

In some embodiments, the insertion member is made of an elastic material, and after being inserted into through-hole, a side wall of the insertion member is attached to a side wall of the through-hole.

In this embodiment, the elastic material may be a rubber or a latex; for example, for a cylindrical through-hole, an aperture of the insertion member made of the elastic material may be slightly larger than an aperture of the through-hole, so that a part of the insertion member plugged into the through-hole is able to press the side wall of the through-hole, thereby preventing a formation of a gap from affecting subsequent copper plating.

In some other embodiments, before step 104 that the inner wall of the blind hole is subjected to copper plating to form the via hole, the method further includes:

upper and lower surfaces of the filled resin are respectively electroplated and filled-in, to form a copper layer of a preset thickness.

In some embodiments, the method further includes:

a release agent is applied to a surface of the insertion member before the insertion member is inserted into the through-hole.

In some embodiments, after the step that the inner wall of the blind hole is subjected to copper plating to form the via hole, the method further includes:

the insertion member is removed from the through-hole.

In the embodiments above, for a case that the insertion member is used to directly shield positions where copper plating is not needed, the problem that the insertion member is difficult to be pulled out after copper plating is able to be prevented by using this manner, so that there is no insertion member remaining in a finally formed via hole, thereby not affecting the appearance and function of the via hole.

In some embodiments, the PCB is internally provided with at least one wiring layer, and the target copper plating length is equal to a distance from any wiring layer inside the PCB to the surface of the PCB.

For example, assuming that the PCB includes five wiring layers in total from a top layer to a bottom layer, and then the target copper plating length may be a distance from each of three intermediate wiring layers to the top wiring layer; and certainly the target copper plating length may also be a distance from each of the three intermediate wiring layers to the bottom wiring layer, so as to ensure the signal transmission effect and avoid the formation of an antenna effect.

In some embodiments, in order to facilitate understanding of the technical solutions in the embodiments of the present disclosure, hereinafter, the solutions in the embodiments of the present disclosure are described in detail by taking a flow for manufacturing the PCB with the via hole as an example. Please refer to FIG. 3, AOI represents Automated Optical Inspection, which is different from a conventional PCB processing flow. According to the method in the embodiments of the present disclosure, resin hole-plugging is performed before copper plating, and the position where the stub is generated in the through-hole in the conventional PCB processing and manufacturing process is first plugged with the resin, and then in a copper plating process, only a signal path, in which copper plating is needed, of the through-hole is plated with copper; and thus, excessive stub will not be generated in the via hole, and there is no need to back drill to remove excessively plated copper. Since the method for manufacturing the via hole in the embodiments of the present disclosure improves the flow after drilling, the contents before drilling will not be described in more detail, and hereinafter, a manufacturing process of the via hole will be divided into four parts for detailed illustration:

First part: drilling; during PCB processing, after drilling, through-holes are generated on the PCB, and at this time, the through-holes pass through the whole PCB, but at this time, there is no copper on the inner wall of each through-hole, and the PCB after drilling is as shown in FIG. 4.

Second part, resin hole-plugging is performed on the through-holes on the PCB after drilling, wherein for the hole-plugging, reference may be made to the following steps:

Step A, the position where the stub is generated in the each through-hole is determined.

When resin hole-plugging is performed on the through-hole, the position where each through-hole stub is generated needs to be determined first. The stub generation position of the each through-hole is related to the signal path thereof, and copper plating is required at a position where the signal runs in the via hole (i.e. a signal path of the via hole), and copper plating is not needed at a position where the signal does not run (if copper plating is performed, this position will become a via hole stub). As shown in FIG. 5, it is necessary to determine signal via hole positions where the stub is not allowed on the whole PCB, and a signal line path (for example, high-speed signals such as PCIE) of each via hole.

Step B: the insertion member is used to protect the signal path of the through-hole.

After the signal via hole positions where the stub is not allowed on the whole PCB are determined, a specific insertion member is manufactured according to the signal path of each via hole; and for the insertion member, reference is able to be made to FIG. 6. The insertion member is used for protecting the signal path part of each via hole when resin hole-plugging is performed on the through-holes on the PCB, so as to prevent the signal path part from being plugged with resin.

Step C, positions where stubs will be generated in the through-holes are filled with resin.

After parts requiring copper plating in the via hole signal paths are protected by the insertion member, the remaining parts of the remaining through-holes are plugged with resin, that is, the through-holes are filled with resin, as shown in FIG. 7.

Third part: electroplating and filling-in are performed, that is, upper and lower surfaces of the resin in the through-holes are electroplated with copper layers. Although the positions where stubs may be generated in the through-holes have been plugged with resin, electroplating and filling-in are still needed. This is because, in some production steps in a subsequent PCB production process, a chemical reagent may react with the PCB. In addition, the resin tends to be aged, and in order to prevent the resin from being aged and then damaging the through-holes, electroplating and filling-in are needed, that is, upper and lower surfaces of the resin in the through-holes are electroplated with copper layers, as shown in FIG. 8.

Fourth part: the through-holes are plated with copper to form via holes. Plated through hole and thickened copper are performed on portions where signal paths run in the through-holes, so as to form via holes without signal stubs, thereby achieving the purpose of completely removing the via hole stubs.

Please refer to FIG. 9, after the via hole manufactured by using the method according to the embodiments of the present disclosure is formed, no back drilling processing is required because there is no stub, and the signal path of each via hole has basically the same design value, which greatly ensures a signal transmission quality on a circuit board, reduces the scrap rate and reduces the production costs.

The method for manufacturing a stub-free via hole has at least the following beneficial technical effects:

(1) By first performing hole-plugging and then performing electroplating in the PCB production process, hole-plugging and copper plating are performed depending on situations regarding different via holes according to an actual routing path of the signal on the PCB, so that the via hole stub is completely removed and there is no residual stub, thereby solving the effect of the via hole stub on the signal integrity of the high-speed line signal link.

(2) The routing area is increased, thereby reducing the routing difficulty in PCB design; and back drilling is not required, so that the routing area near a via hole of a back drilling layer is not reduced due to the back drilling process, and the method is suitable for various types of PCBs, and has better universality.

(3) The probability of successful PCB processing is increased, thereby reducing costs.

In some other embodiments, embodiments of the present disclosure further provide a PCB, wherein the PCB includes at least one via hole, and the at least one via hole is formed by using the method for manufacturing a stub-free via hole, and the method for manufacturing the stub-free via hole includes the following steps:

a target copper plating length of a to-be-opened via hole is acquired;

a through-hole is formed at a position of the to-be-opened via hole along a thickness direction of a PCB;

the through-hole is blocked to form a blind hole, so that a distance from a bottom of the blind hole to a surface of the PCB is equal to the target copper plating length; and an inner wall of the blind hole is subjected to copper plating to form a via hole.

In some embodiments, the step that the through-hole is blocked to form the blind hole, so that the distance from the bottom of the blind hole to the surface of the PCB is equal to the target copper plating length, includes:

an insertion member matching a shape of the through-hole is manufactured and the insertion member is inserted into the through-hole from a first surface of the PCB, wherein a length of the insertion member remaining in the through-hole is equal to the target copper plating length, and the first surface is a surface where the to-be-opened via hole intersects the PCB;

from a second surface opposite the first surface, a region where the insertion member is not inserted into the through-hole is filled with resin; and the insertion member is removed from the through-hole to form the blind hole.

In some embodiments, the step that the through-hole is blocked to form the blind hole, so that the distance from the bottom of the blind hole to the surface of the PCB is equal to the target copper plating length, includes:

an insertion member matching a shape of the through-hole is manufactured and the insertion member is inserted into the through-hole from a second surface opposite a first surface of the PCB to form the blind hole, wherein a length of the insertion member remaining in the through-hole is equal to a difference between the thickness of the PCB and the target copper plating length.

In some embodiments, the insertion member is made of an elastic material, and after being inserted into the through-hole, a side wall of the insertion member is attached to a side wall of the through-hole.

In some embodiments, before the step that the inner wall of the blind hole is subjected to copper plating to form the via hole, the method further includes:

upper and lower surfaces of the filled resin are respectively electroplated and filled-in, to form a copper layer of a preset thickness.

In some embodiments, the method further includes:

a release agent is applied to a surface of the insertion member before the insertion member is inserted into the through-hole.

In some embodiments, after the step that the inner wall of the blind hole is subjected to copper plating to form the via hole, the method further includes:

the insertion member is removed from the through-hole.

In some embodiments, the PCB is internally provided with at least one wiring layer, and the target copper plating length is equal to a distance from any wiring layer inside the PCB to the surface of the PCB.

In some embodiments, embodiments of the present disclosure further provide an electronic device, wherein the electronic device may include the PCB with at least one via hole, and the at least one via hole is formed by using the method for manufacturing a stub-free via hole, and the method for manufacturing a stub-free via hole includes the following steps:

a target copper plating length of a to-be-opened via hole is acquired;

a through-hole is formed at a position of the to-be-opened via hole along a thickness direction of a PCB;

the through-hole is blocked to form a blind hole, so that a distance from the bottom of the blind hole to a surface of the PCB is equal to the target copper plating length; and an inner wall of the blind hole is subjected to copper plating to form a via hole.

In some embodiments, the step that the through-hole is blocked to form the blind hole, so that the distance from the bottom of the blind hole to the surface of the PCB is equal to the target copper plating length, includes:

an insertion member matching a shape of the through-hole is manufactured and the insertion member is inserted into the through-hole from a first surface of the PCB, wherein a length of the insertion member remaining in the through-hole is equal to the target copper plating length, and the first surface is a surface where the to-be-opened via hole intersects the PCB;

from a second surface opposite the first surface, a region where the insertion member is not inserted into the through-hole is filled with resin; and the insertion member is removed from the through-hole to form the blind hole.

In some embodiments, the step that the through-hole is blocked to form the blind hole, so that the distance from the bottom of the blind hole to the surface of the PCB is equal to the target copper plating length, includes:

an insertion member matching a shape of the through-hole is manufactured and the insertion member is inserted into the through-hole from a second surface opposite a first surface of the PCB to form the blind hole, wherein a length of the insertion member remaining in the through-hole is equal to a difference between the thickness of the PCB and the target copper plating length.

In some embodiments, the insertion member is made of an elastic material, and after being inserted into through-hole, a side wall of the insertion member is attached to a side wall of the through-hole.

In some embodiments, before the step that the inner wall of the blind hole is subjected to copper plating to form the via hole, the method further includes:

upper and lower surfaces of the filled resin are respectively electroplated and filled-in, to form a copper layer of a preset thickness.

In some embodiments, the method further includes:

a release agent is applied to a surface of the insertion member before the insertion member is inserted into the through-hole.

In some embodiments, after the step that the inner wall of the blind hole is subjected to copper plating to form the via hole, the method further includes:

the insertion member is removed from the through-hole.

In some embodiments, the PCB is internally provided with at least one wiring layer, and the target copper plating length is equal to a distance from any wiring layer inside the PCB to the surface of the PCB.

In some other embodiments provided in some embodiments of the present disclosure, further provided is a non-transitory readable storage medium, the non-transitory readable storage medium storing instructions, that when running on a computer, cause the computer to execute the method for manufacturing a stub-free via hole according to any one of the embodiments above.

Various technical features of the embodiments above can be combined in any way, and in order to make the illustration brief, all possible combinations of the technical features of the embodiments above are not described. However, as long as the combination of these technical features is not contradictory, the technical features should be considered to fall within the scope disclosed in the description.

The content above merely relates to exemplary embodiments of the present disclosure, but it should be noted that various changes and modifications could be made without departing from the scope disclosed in the embodiments of the present disclosure as defined in the appended claims. The functions, steps and/or actions of the method claims in accordance with the disclosed embodiments described herein need not be performed in any particular sequence. The serial numbers of the embodiments disclosed in the embodiments of the present disclosure are only for illustration, and do not represent the preference of the embodiments. In addition, although elements disclosed in the embodiments of the present disclosure may be described or claimed in an individual form, unless explicitly limited to a singular number, it is also understood that there may be multiple elements.

It should be understood that as used herein, the singular form "a (an)" is intended to comprise plural forms as well, unless the context clearly supports exceptions. It should also be understood that "and/or" as used herein refers to any and all possible combinations comprising one or more associated items listed.

It should be understood by a person of ordinary skill in the art that the discussion of any embodiment above is merely exemplary, and is not intended to imply that the scope (comprising the claims) disclosed in embodiments of the present disclosure is limited to these examples. Under the idea of the embodiments of the present disclosure, technical features in the described embodiments or in different embodiments may also be combined, and there are many other variations of different aspects of the embodiments of the present disclosure, but for simplicity, they are not provided in detail. Therefore, any omissions, modifications, equivalent replacements, improvements, etc. made within the spirit and principle of embodiments of the present disclosure shall all fall within the scope of protection of embodiments of the present disclosure.

What is claimed is:

1. A method for manufacturing a stub-free via hole, the method comprising:

acquiring a target copper plating length of a to-be-opened via hole;

forming a through-hole at a position of the to-be-opened via hole along a thickness direction of a PCB;

blocking the through-hole to form a blind hole, so that a distance from a bottom of the blind hole to a surface of the PCB is equal to the target copper plating length by:

manufacturing an insertion member matching a shape of the through-hole and inserting the insertion member into the through-hole from a first surface of the PCB, wherein a length of the insertion member remaining in the through-hole is equal to the target copper plating length, and the first surface is a surface where the to-be-opened via hole intersects the PCB;

from a second surface opposite the first surface, filling a region where the insertion member is not inserted into the through-hole with resin;

and removing the insertion member from the through-hole to form the blind hole;

and performing copper plating on an inner wall of the blind hole to form a via hole.

2. The method for manufacturing a stub-free via hole as claimed in claim 1, wherein a step of blocking the through-hole to form the blind hole, so that the distance from the bottom of the blind hole to the surface of the PCB is equal to the target copper plating length, comprises:

manufacturing an insertion member matching a shape of the through-hole and inserting the insertion member into the through-hole from a second surface opposite a first surface of the PCB to form the blind hole, wherein a length of the insertion member remaining in the through-hole is equal to a difference between the thickness of the PCB and the target copper plating length.

3. The method for manufacturing a stub-free via hole as claimed in claim 2, wherein the method further comprises:

applying a release agent to a surface of the insertion member before inserting the insertion member into the through-hole.

4. The method for manufacturing a stub-free via hole as claimed in claim 2, wherein after a step of performing copper plating on the inner wall of the blind hole to form the via hole, the method further comprises:

removing the insertion member from the through-hole.

5. The method for manufacturing a stub-free via hole as claimed in claim 1, wherein the insertion member is made of an elastic material, and after being inserted into the through-hole, a side wall of the insertion member is attached to a side wall of the through-hole.

6. The method for manufacturing a stub-free via hole as claimed in claim 5, wherein an aperture of the insertion member made of the elastic material is larger than an aperture of the through-hole, so that a part of the insertion member plugged into the through-hole presses the side wall of the through-hole.

7. The method for manufacturing a stub-free via hole as claimed in claim 1, wherein before a step of performing copper plating on the inner wall of the blind hole to form the via hole, the method further comprises:

respectively performing electroplating and filling-in on upper and lower surfaces of the filled resin, to form a copper layer of a preset thickness.

8. The method for manufacturing a stub-free via hole as claimed in claim 1, wherein the PCB is internally provided with at least one wiring layer, and the target copper plating length is equal to a distance from any wiring layer inside the PCB to the surface of the PCB.

9. The method for manufacturing a stub-free via hole as claimed in claim 1, wherein the target copper plating length refers to a desired copper plating length during design of the via hole.

10. The method for manufacturing a stub-free via hole as claimed in claim 9, wherein during design of the via hole in the PCB, in cases where a third wiring layer for connecting a top wiring layer of the PCB to the inside is reserved, the target copper plating length is a distance from the top wiring layer to the third wiring layer.

11. The method for manufacturing a stub-free via hole as claimed in claim 1, wherein blocking the through-hole, comprises:

blocking a partial region of the opened through-hole.

12. The method for manufacturing a stub-free via hole as claimed in claim 11, wherein a way of blocking comprises dividing the through-hole into two parts at a blocking position or directly blocking a part of the through-hole.

13. The method for manufacturing a stub-free via hole as claimed in claim 1, wherein the first surface and the second surface refer to two surfaces of the PCB, and the first surface is an uppermost layer among wiring layers, or a bottom layer among wiring layers.

14. The method for manufacturing a stub-free via hole as claimed in claim 1, wherein from the second surface opposite the first surface, filling the region where the insertion member is not inserted into the through-hole with resin, comprises:

pre-heating the resin such that the resin is molten into a molten state, then filling a position of the through-hole not shielded by the insertion member with the resin in the molten state, and thus this part of the region of the through-hole is completely filled.

15. The method for manufacturing a stub-free via hole as claimed in claim 1, wherein when a plurality of via holes exist on the PCB, the method further comprises:

reserving a part of length when the insertion member corresponding to each via hole among the plurality of via holes is manufactured, and fixing an end of the insertion member corresponding to the each via hole on a jack panel according to a positional relationship between the via holes.

16. The method for manufacturing a stub-free via hole as claimed in claim 15, wherein the jack panel and the insertion member corresponding to the each via hole are connected in a detachable manner.

17. A PCB, wherein the PCB comprises at least one via hole, and the at least one via hole is formed by using the method for manufacturing a stub-free via hole as claimed in claim 1.

18. An electronic device, wherein the electronic device comprises a PCB with at least one via hole, and the at least one via hole is formed by using the method for manufacturing a stub-free via hole as claimed in claim 1.

19. A non-transitory readable storage medium, wherein the non-transitory readable storage medium comprises a stored program, which when running, executes steps of the method as claimed in claim 1.

\* \* \* \* \*